(12) United States Patent
Feller et al.

(10) Patent No.: US 8,445,858 B2
(45) Date of Patent: May 21, 2013

(54) NEUTRON DETECTION AND COLLIMATION

(75) Inventors: W. Bruce Feller, Tolland, CT (US); Paul L. White, Sturbridge, MA (US); William J. S. Zhong, Stamford, CT (US)

(73) Assignee: Nova Scientific, Inc., Sturbridge, MA (US)

( * ) Notice: Subject to any disclaimer, the term of this patent is extended or adjusted under 35 U.S.C. 154(b) by 136 days.

(21) Appl. No.: 12/273,770

(22) Filed: Nov. 19, 2008

(65) Prior Publication Data

US 2010/0123085 A1    May 20, 2010

(51) Int. Cl.
*G01T 3/00* (2006.01)

(52) U.S. Cl.
USPC ................... 250/390.01; 250/391

(58) Field of Classification Search
USPC ............................ 250/390.01, 391
See application file for complete search history.

(56) References Cited

U.S. PATENT DOCUMENTS

| | | | | |
|---|---|---|---|---|
| 2,049,765 A | * | 8/1936 | Fischer | 252/301.4 R |
| 3,032,428 A | * | 5/1962 | Ginther | 436/58 |
| 4,367,012 A | * | 1/1983 | Ikeda et al. | 385/144 |
| 4,683,114 A | | 7/1987 | Ho et al. | |
| 4,918,315 A | | 4/1990 | Gomberg et al. | |
| 4,970,178 A | | 11/1990 | Klimas et al. | |
| 4,983,551 A | | 1/1991 | Feller et al. | 501/74 |
| 5,015,909 A | | 5/1991 | Zhong et al. | 313/105 R |
| 5,108,961 A | | 4/1992 | Zhong et al. | 501/65 |
| 5,391,320 A | | 2/1995 | Buchanan et al. | |
| 5,569,630 A | | 10/1996 | Landa et al. | |
| 5,973,328 A | | 10/1999 | Hiller et al. | |
| 6,828,714 B2 | | 12/2004 | Downing et al. | 313/103 CM |
| 6,876,711 B2 | | 4/2005 | Wallace et al. | |
| 7,183,701 B2 | | 2/2007 | Downing et al. | 313/13 R |
| 7,233,007 B2 | | 6/2007 | Downing et al. | |
| 7,250,119 B2 | | 7/2007 | Sayala | |
| 7,333,701 B1 | | 2/2008 | Feller et al. | 385/123 |
| 7,372,009 B1 | | 5/2008 | Losee et al. | |
| 2003/0205956 A1 | | 11/2003 | Downing et al. | 313/104 |
| 2004/0256967 A1 | | 12/2004 | Downing et al. | 313/103 R |
| 2005/0205798 A1 | | 9/2005 | Downing et al. | 250/390.11 |
| 2008/0026188 A1 | * | 1/2008 | D'urso et al. | 428/188 |
| 2008/0067394 A1 | | 3/2008 | Feller et al. | |

OTHER PUBLICATIONS

Tremsin et al. Efficiency optimization of microchannel plate (MCP) neutron imaging detectors. I. Square channels with 10B doping, Nuclear Instruments and Methods in Physics Research A, vol. 539, No. 1-2 (Feb. 2005), pp. 278-311.*
International Search Report and Written Opinion dated Jan. 20, 2010, for corresponding application PCT/US2009/064906.
Bruce W. Feller et al., U.S. Appl. No. 60/893,484, filed Mar. 7, 2007, 18 pages.

* cited by examiner

*Primary Examiner* — David Porta
*Assistant Examiner* — Shun Lee
(74) *Attorney, Agent, or Firm* — Fish & Richardson P.C.

(57) ABSTRACT

A device includes a neutron-sensitive composition. The composition includes, in weight percent, a non-zero amount of aluminum oxide (e.g., approximately 1% to approximately 3.5% aluminum oxide), greater than 12% (e.g., approximately 12% to approximately 17%) boron oxide, greater than approximately 60% silicon oxide (e.g., approximately 62% to approximately 68% silicon oxide), and a non-zero amount of sodium oxide (e.g., approximately 10% to approximately 14% sodium oxide). The device is capable of interacting with neutrons to form an electron cascade.

11 Claims, 4 Drawing Sheets

NEUTRON DETECTION AND COLLIMATION

TECHNICAL FIELD

The invention relates to neutron detection and collimation, such as, for example, neutron-sensitive materials, neutron detectors, neutron collimators, methods of detecting neutrons, and methods of collimating neutrons.

BACKGROUND

Neutrons can be detected to indicate the presence of special nuclear materials, such as plutonium, or to be used in neutron imaging. An example of a neutron detector is a neutron-sensitive microchannel plate (MCP). An MCP can be formed by bonding a glass plate between an input electrode and an output electrode, and providing a high voltage direct current (DC) field between the electrodes. The glass plate is perforated with a substantially regular, parallel array of microscopic channels, e.g., cylindrical and hollow channels. Each channel, which can serve as an independent electron multiplier, has an inner wall surface formed of a semi-conductive and electron emissive layer.

The MCP can be made neutron-sensitive by doping the glass plate with, e.g., boron-10 particles, which can capture neutrons in reactions that generate lithium-7 and alpha particles. As the lithium-7 and alpha particles enter nearby channels and collide against the wall surfaces to produce secondary electrons, a cascade of electrons can be formed as the secondary electrons accelerate along the channels (due to the DC field), and collide against the wall surfaces farther along the channels, thereby increasing the number of secondary electrons. The electron cascades develop along the channels and are amplified into detectable signals that can be electronically registered and sometimes processed to construct an image. The resultant intensity map or image corresponds to the variation in neutron flux striking the surface of the MCP. Contrast differences within the image of a sample can be used to infer physical and chemical properties.

SUMMARY

The invention relates to neutron detection and collimation, such as, for example, neutron-sensitive materials, neutron detectors, neutron collimators, methods of detecting neutrons, and methods of collimating neutrons.

In one aspect, the invention features a device including a neutron-sensitive composition. The composition includes, in weight percent, aluminum oxide (e.g., approximately 1% to approximately 3.5% aluminum oxide), greater than 12% (e.g., approximately 12% to approximately 17%) boron oxide, silicon oxide (e.g., approximately 62% to approximately 68% silicon oxide), and sodium oxide (e.g., approximately 10% to approximately 14% sodium oxide). The device is capable of interacting with neutrons to form an electron cascade.

Embodiments may include one or more of the following features. The boron oxide includes substantially boron-10 enriched boron oxide. The composition further includes a non-zero amount of calcium oxide less than approximately 4 weight percent. The composition further includes a non-zero amount of magnesium oxide less than approximately 3 weight percent. The composition further includes a non-zero amount of arsenic oxide or antimony oxide less than approximately 0.5 weight percent. The composition further includes a non-zero amount of lithium oxide less than approximately 2 weight percent. The composition is substantially free of lead. The boron oxide is substantially boron-10 enriched boron oxide.

In some embodiments, the composition consists essentially of, in weight percent, approximately 1% to approximately 3.5% aluminum oxide, approximately 12% to approximately 17% boron oxide, approximately 62% to approximately 68% silicon oxide, approximately 10% to approximately 14% sodium oxide, approximately 0% to approximately 4% calcium oxide, approximately 0% to approximately 3% magnesium oxide, approximately 0% to approximately 0.5% antimony oxide or arsenic oxide, and approximately 0% to approximately 2% lithium oxide.

The device can further include a structure having a plurality of channels and the neutron-sensitive composition. The channels can include a conducting and electron emissive surface.

In another aspect, the invention features a method, including: contacting a neutron-sensitive composition with neutrons, the composition including, in weight percent, a non-zero amount of aluminum oxide, approximately 12% to approximately 17% boron oxide, silicon oxide (e.g., greater than approximately 60%), and a non-zero amount of sodium oxide; and detecting a signal resulting from the contact of the neutrons with the composition.

Embodiments may include one or more of the following features. The boron oxide includes substantially boron-10 enriched boron oxide. The composition further includes a non-zero amount of calcium oxide less than approximately 4 weight percent. The composition further includes a non-zero amount of magnesium oxide less than approximately 3 weight percent. The composition further includes a non-zero amount of arsenic oxide or antimony oxide less than approximately 0.5 weight percent. The composition further includes a non-zero amount of lithium oxide less than approximately 2 weight percent. The composition is substantially free of lead.

In some embodiments, the composition consists essentially of, in weight percent, approximately 1% to approximately 3.5% aluminum oxide, approximately 12% to approximately 17% boron oxide, approximately 62% to approximately 68% silicon oxide, approximately 10% to approximately 14% sodium oxide, approximately 0% to approximately 4% calcium oxide, approximately 0% to approximately 3% magnesium oxide, approximately 0% to approximately 0.5% antimony oxide or arsenic oxide, and approximately 0% to approximately 2% lithium oxide. The boron oxide can include substantially boron-10 enriched boron oxide.

In some embodiments, the neutron-sensitive composition forms at least a portion of a structure including a plurality of channels. The channels can include a conducting and electron emissive surface.

The method can further include processing a plurality of signals to construct an image.

In another aspect, the invention features a method, including: collimating neutrons with a composition including, in weight percent, a non-zero amount of aluminum oxide, approximately 12% to approximately 17% boron oxide, silicon oxide (e.g., greater than approximately 60%), and a non-zero amount of sodium oxide.

Embodiments may include one or more of the following features. The boron oxide includes substantially boron-10 enriched boron oxide. The composition further includes a non-zero amount of calcium oxide less than approximately 4 weight percent. The composition further includes a non-zero amount of magnesium oxide less than approximately 3 weight percent. The composition further includes a non-zero amount of arsenic oxide or antimony oxide less than approximately 0.5 weight percent. The composition further includes a non-zero amount of lithium oxide less than approximately 2 weight percent. The composition is substantially free of lead.

In some embodiments, the composition consists essentially of, in weight percent, approximately 1% to approximately 3.5% aluminum oxide, approximately 12% to approximately 17% boron oxide, approximately 62% to approximately 68% silicon oxide, approximately 10% to approximately 14% sodium oxide, approximately 0% to approximately 4% calcium oxide, approximately 0% to approximately 3% magnesium oxide, approximately 0% to approximately 0.5% antimony oxide or arsenic oxide, and approximately 0% to approximately 2% lithium oxide. The boron oxide can include substantially boron-10 enriched boron oxide. The neutron-sensitive composition forms at least a portion of a structure comprising a plurality of channels.

In another aspect, the invention features a neutron collimator, including: a structure including a plurality of parallel channels, the structure having a composition including, in weight percent, a non-zero amount of aluminum oxide, approximately 12% to approximately 17% boron oxide, silicon oxide (e.g., greater than approximately 60%), and a non-zero amount of sodium oxide.

Embodiments may include one or more of the following features. The boron oxide includes substantially boron-10 enriched boron oxide. The composition further includes a non-zero amount of calcium oxide less than approximately 4 weight percent. The composition further includes a non-zero amount of magnesium oxide less than approximately 3 weight percent. The composition further includes a non-zero amount of arsenic oxide or antimony oxide less than approximately 0.5 weight percent. The composition further includes a non-zero amount of lithium oxide less than approximately 2 weight percent. The composition is substantially free of lead.

In some embodiments, the composition consists essentially of, in weight percent, approximately 1% to approximately 3.5% aluminum oxide, approximately 12% to approximately 17% boron oxide, approximately 62% to approximately 68% silicon oxide, approximately 10% to approximately 14% sodium oxide, approximately 0% to approximately 4% calcium oxide, approximately 0% to approximately 3% magnesium oxide, approximately 0% to approximately 0.5% antimony oxide or arsenic oxide, and approximately 0% to approximately 2% lithium oxide. The boron oxide can include substantially boron-10 enriched boron oxide.

In another aspect, the invention features a device, including: a neutron-sensitive composition including, in weight percent, a non-zero amount of aluminum oxide, greater than approximately 13% gadolinium oxide, silicon oxide (e.g., greater than 40%), and a non-zero amount of sodium oxide, wherein the device is capable of interacting with neutrons to form an electron cascade.

Embodiments may include one or more of the following features. The composition further includes approximately zero weight percent to approximately 12 weight percent boron oxide. The boron oxide is substantially boron-10 enriched boron oxide. The composition further includes a non-zero amount of lithium oxide less than approximately 2 weight percent. The composition further includes a non-zero amount of calcium oxide less than approximately 6 weight percent. The composition further includes a non-zero amount of barium oxide or antimony oxide less than approximately 10 weight percent. The composition further includes a non-zero amount of zinc oxide less than approximately 10 weight percent. The composition is substantially free of lead.

In some embodiments, the composition consists essentially of, in weight percent, approximately 1% to approximately 3% aluminum oxide, approximately 0% to approximately 12% boron oxide, approximately 40% to approximately 68% silicon oxide, approximately 0% to approximately 2% lithium oxide, approximately 2% to approximately 8% sodium oxide, approximately 2% to approximately 6% calcium oxide, approximately 0% to approximately 10% barium oxide, approximately 3% to approximately 10% zinc oxide, approximately 0% to approximately 3% titanium oxide, approximately 10% to approximately 20% gadolinium oxide, and approximately 0% to approximately 1% antimony oxide.

In some embodiments, the device further includes a structure having a plurality of channels and the neutron-sensitive composition. The channels can include a conducting and electron emissive surface.

In another aspect, the invention features a method, including: contacting a neutron-sensitive composition with neutrons, the composition including, in weight percent, a non-zero amount of aluminum oxide, greater than approximately 13% gadolinium oxide, silicon oxide (e.g., greater than 40%), and a non-zero amount of sodium oxide; and detecting a signal resulting from the contact of the neutrons with the composition.

Embodiments may include one or more of the following features. The composition further includes approximately zero weight percent to approximately 12 weight percent boron oxide. The boron oxide is substantially boron-10 enriched boron oxide. The composition further includes a non-zero amount of lithium oxide less than approximately 2 weight percent. The composition further includes a non-zero amount of calcium oxide less than approximately 6 weight percent. The composition further includes a non-zero amount of barium oxide or antimony oxide less than approximately 10 weight percent. The composition further includes a non-zero amount of zinc oxide less than approximately 10 weight percent. The composition is substantially free of lead.

In some embodiments, the composition consists essentially of, in weight percent, approximately 1% to approximately 3% aluminum oxide, approximately 0% to approximately 12% boron oxide, approximately 40% to approximately 68% silicon oxide, approximately 0% to approximately 2% lithium oxide, approximately 2% to approximately 8% sodium oxide, approximately 2% to approximately 6% calcium oxide, approximately 0% to approximately 10% barium oxide, approximately 3% to approximately 10% zinc oxide, approximately 0% to approximately 3% titanium oxide, approximately 10% to approximately 20% gadolinium oxide, and approximately 0% to approximately 1% antimony oxide.

In some embodiments, the neutron-sensitive composition forms at least a portion of a structure comprising a plurality of channels. The channels can include a conducting and electron emissive surface.

In some embodiments, the method further includes processing a plurality of signals to construct an image.

In another aspect, the invention features a method, including: collimating neutrons with a composition comprising, in weight percent, a non-zero amount of aluminum oxide, greater than approximately 13% gadolinium oxide, silicon oxide (e.g., greater than 40%), and a non-zero amount of sodium oxide.

Embodiments may include one or more of the following features. The composition further includes approximately zero weight percent to approximately 12 weight percent boron oxide. The boron oxide is substantially boron-10 enriched boron oxide. The composition further includes a non-zero amount of lithium oxide less than approximately 2 weight percent. The composition further includes a non-zero amount of calcium oxide less than approximately 6 weight percent. The composition further includes a non-zero amount of barium oxide or antimony oxide less than approximately 10 weight percent. The composition further includes a non-zero amount of zinc oxide less than approximately 10 weight percent. The composition is substantially free of lead.

In some embodiments, the composition consists essentially of, in weight percent, approximately 1% to approximately 3% aluminum oxide, approximately 0% to approximately 12% boron oxide, approximately 40% to approximately 68% silicon oxide, approximately 0% to approximately 2% lithium oxide, approximately 2% to approximately 8% sodium oxide, approximately 2% to approximately 6% calcium oxide, approximately 0% to approximately 10% barium oxide, approximately 3% to approximately 10% zinc oxide, approximately 0% to approximately 3% titanium oxide, approximately 10% to approximately 20% gadolinium oxide, and approximately 0% to approximately 1% antimony oxide.

In some embodiments, the neutron-sensitive composition forms at least a portion of a structure having a plurality of channels.

In another aspect, the invention features a neutron collimator, including: a structure comprising a plurality of parallel channels, the structure including a composition having, in weight percent, a non-zero amount of aluminum oxide, greater than approximately 13% gadolinium oxide, silicon oxide (e.g., greater than 40%), and a non-zero amount of sodium oxide.

Embodiments may include one or more of the following features. The composition further includes approximately zero weight percent to approximately 12 weight percent boron oxide. The boron oxide is substantially boron-10 enriched boron oxide. The composition further includes a non-zero amount of lithium oxide less than approximately 2 weight percent. The composition further includes a non-zero amount of calcium oxide less than approximately 6 weight percent. The composition further includes a non-zero amount of barium oxide or antimony oxide less than approximately 10 weight percent. The composition further includes a non-zero amount of zinc oxide less than approximately 10 weight percent. The composition is substantially free of lead.

In some embodiments, the composition consists essentially of, in weight percent, approximately 1% to approximately 3% aluminum oxide, approximately 0% to approximately 12% boron oxide, approximately 40% to approximately 68% silicon oxide, approximately 0% to approximately 2% lithium oxide, approximately 2% to approximately 8% sodium oxide, approximately 2% to approximately 6% calcium oxide, approximately 0% to approximately 10% barium oxide, approximately 3% to approximately 10% zinc oxide, approximately 0% to approximately 3% titanium oxide, approximately 10% to approximately 20% gadolinium oxide, and approximately 0% to approximately 1% antimony oxide.

Embodiments may further include one or more of the following features or advantages.

The neutron-sensitive compositions have high sensitivities for neutrons to provide detection with high signal to noise ratios. The compositions are sensitive to both thermal neutrons and higher energy neutrons, with the neutron absorption in the detector inversely proportional to energy. In some embodiments, efficiencies of up to approximately 78% can be obtained.

The high boron-10 concentrations can provide relatively high sensitivity to neutrons, while the low lead content can provide relatively low sensitivity to gamma rays.

The compositions are stable up to high temperatures. The compositions can be melted, cast, extruded (e.g., into hollow tubing), made into solid fibers, and processed with compatible etchable glasses. In some embodiments, the compositions are not substantially affected (e.g., etched) by acids, such as nitric acid or hydrochloric acid. The compositions can be formed into MCPs using glass processing methods.

The chemical constituents (e.g., atomic species and concentrations) of the compositions (e.g., glasses) described herein can be determined by quantitative elemental analysis of the compositions. The constituents have been expressed as the binary oxides of atomic species, e.g., silicon (Si) is expressed as silicon oxide ($SiO_2$). One skilled in the art understands that the compositions themselves do not necessarily include, for example, $SiO_2$, in its binary form (such as by having the crystal structure of $SiO_2$).

As used herein, "a non-zero amount" means an amount greater than a trace amount or an impurity-level amount. In some embodiments, starting materials having a purity of at least 99.9 weight percent are used.

Unless indicated otherwise, all concentration percentages are expressed in weight percent.

Other aspects, features and advantages will be apparent from the description of the embodiments thereof and from the claims.

DETAILED DESCRIPTION

Figure 1:
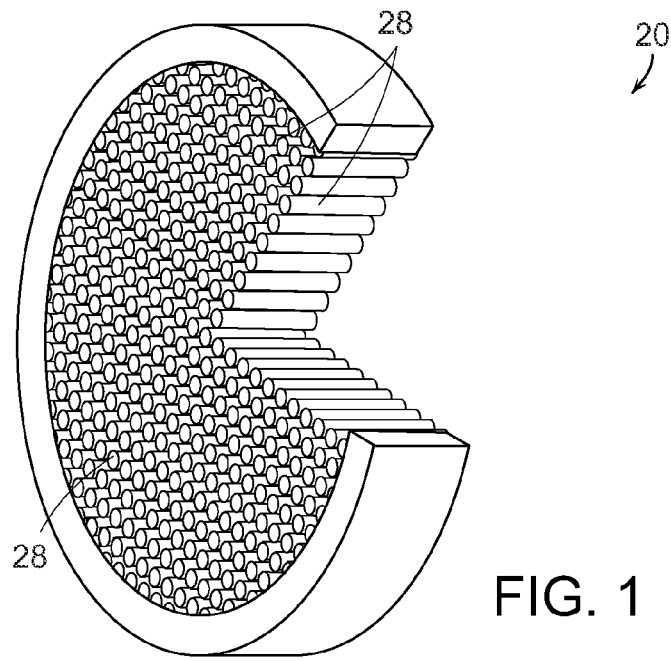
FIG. 1 is a perspective illustration of an embodiment of a microchannel plate.
Figure 2:
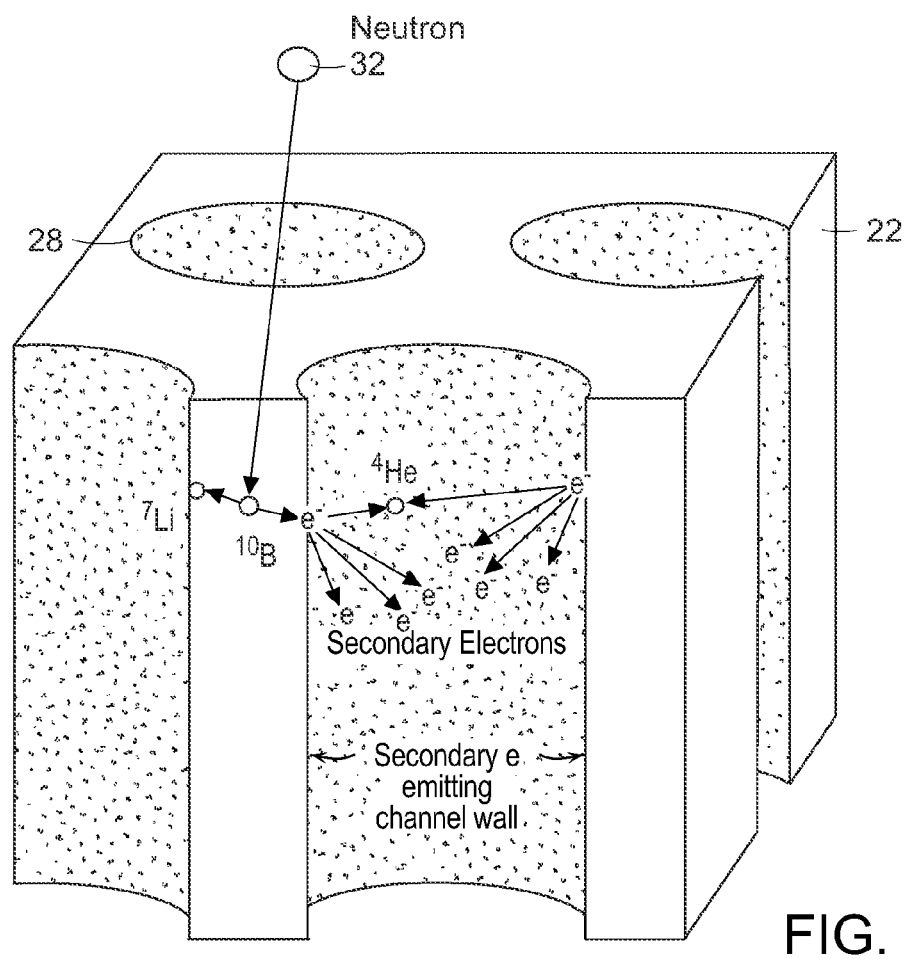
FIG. 2 is a schematic diagram of neutron capture and conversion in a neutron-sensitive MCP.
Figure 3:
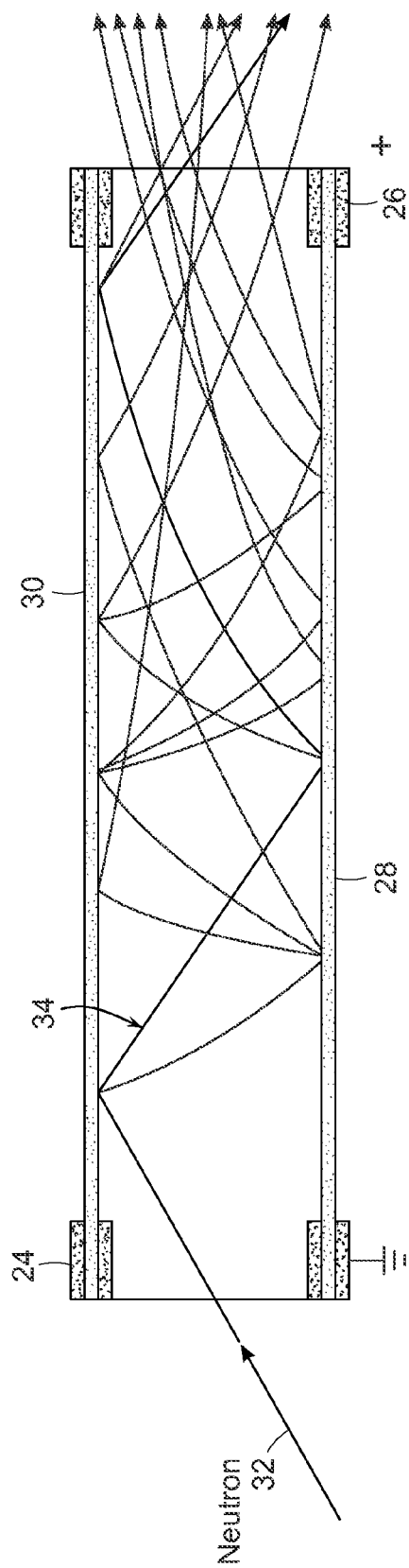
FIG. 3 is a schematic diagram of an embodiment of a microchannel.

Referring to FIGS. 1, 2 and 3, a neutron-sensitive microchannel plate (MCP) 20 includes a glass plate 22 bonded between an input electrode 24 and an output electrode 26. Electrodes 24, 26 are capable of holding a high voltage direct current (DC) field between them. Plate 22 includes a substantially regular, parallel array of microscopic channels 28, e.g., cylindrical and hollow channels. Each channel 28, which can serve as an independent electron multiplier, has an inner wall surface formed of a semi-conductive and electron emissive layer 30. Each channel 28 further includes (e.g., is formed of) one or more neutron-sensitive compositions that include boron-10 ($^{10}B$), or boron-10 ($^{10}B$) and gadolinium ($^{155}Gd$, $^{157}Gd$). In some embodiments, lithium-6, which is a neutron absorber used for net detection, can be included (e.g., at approximately 0-2 wt %).

In operation, when an incident neutron 32 strikes plate 22, the neutron is captured by a boron-10 atom, and an alpha particle ($^4He$) and a lithium-7 particle are released, as in the reaction below:

where Q is the energy released in the reaction. Referring particularly to FIG. 2, one or both of the lithium-7 and helium-4 particles pass out of the glass and enter one or more adjacent channels 28, freeing electrons 34 along the way. Concurrently, a DC bias voltage is applied between electrodes 24, 26 such that output electrode 26 has a more positive DC bias voltage than input electrode 24. The DC bias voltage generates an electric field (e.g., about 1 kV/mm) that attracts free electrons 34 toward output electrode 26. As free electrons 34 strike the channel walls, more electrons are released to form a cascade of electrons. From a single neutron, many (e.g., thousands of) electrons emerge from microchannel plate 20. Thus, plate 22 acts as an electron multiplier. The cascade of electrons can be electronically captured as a detection signal at output electrode 26 or allowed to strike a phosphor screen for imaging. In some embodiments, the signal is read out and sent to a signal processor, such as a coincidence unit described in U.S. Published Application 2008-0067394, filed on Sep. 18, 2006, and entitled "Neutron Detection Based on Coincidence Signal".

In addition to using boron-10 to capture neutrons, the neutron-sensitive composition can include gadolinium (Gd), with or without boron, to capture neutrons as in the following reactions:

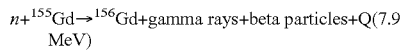

$n+{}^{155}Gd \rightarrow {}^{156}Gd$+gamma rays+beta particles+Q(7.9 MeV)

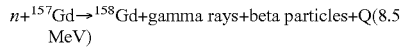

$n+{}^{157}Gd \rightarrow {}^{158}Gd$+gamma rays+beta particles+Q(8.5 MeV)

The beta particles can generate an electron cascade similarly to the lithium-7 and helium-4 particles described above. Furthermore, when gadolinium atoms capture neutrons, gamma rays (e.g., primarily sub-200 keV gamma rays) are emitted simultaneously and can be detected, as described in U.S. Ser. No. 60/893,484, filed on Mar. 7, 2007, and entitled "Radiation Detectors and Related Methods".

As indicated above, in some embodiments, neutron-sensitive compositions include (e.g., is formed of) a glass including boron-10. The compositions can include as an intimate and homogeneous mixture, in weight percent:

TABLE 1

| Material | Weight Percent |
| --- | --- |
| $Al_2O_3$ | 1-3.5 |
| $B_2O_3$ | 12-17 |
| $SiO_2$ | 62-68 |
| $Na_2O$ | 10-14 |
| CaO | 0-4 |
| MgO | 0-3 |
| $As_2O_3$ or $Sb_2O_3$ | 0-0.5 |
| $Li_2O$ | 0-2 |

In some embodiments, the compositions consist essentially of or consist of the materials listed in Table 1 and described below.

Without being bound by theory, it is believed that aluminum oxide serves as a secondary glass builder that enhances the stability of the neutron-sensitive compositions and reduces the occurrence of phase separation. For example, aluminum oxide can enhance the durability of the compositions in moist and/or acidic environments, such as during etching. Aluminum oxide can also enhance the chemical stability of the composition while allowing the composition to melt controllably to ease processing of the composition. The concentration of aluminum oxide can range from approximately 1.0 weight percent to approximately 3.5 weight percent. For example, the aluminum oxide concentration can be greater than or equal to, in weight percent, approximately 1%, approximately 1.5%, approximately 2%, approximately 2.5%, or approximately 3%; and/or less than or equal to approximately 3.5%, approximately 3%, approximately 2.5%, approximately 2%, or approximately 1.5%.

Boron oxide, such as natural boron oxide and/or boron-10 enriched boron oxide, is used to provide the composition with boron-10 for neutron capture. The higher the amount of boron-10 isotope, the higher the neutron sensitivity can be. The boron oxide can have, e.g., greater than approximately one wt % ${}^{10}B$, greater than approximately 3 wt % ${}^{10}B$, greater than approximately 5 wt % ${}^{10}B$, or approximately 10% boron-10. It is believed that boron oxide can also make the composition easier to melt, thereby enhancing processing. Boron oxide may also lower the thermal expansion of the neutron-sensitive composition, thereby decreasing the occurrence of breakage due to thermal shock. The concentration of boron oxide (natural and/or enriched) can range from approximately 12 weight percent to approximately 17 weight percent. For example, the boron oxide concentration can be greater than or equal to, in weight percent, approximately 12%, approximately 13%, approximately 14%, approximately 15%, or approximately 16%; and/or less than or equal to approximately 17%, approximately 16%, approximately 15%, approximately 14%, or approximately 13%.

Silicon oxide is the basic former of the neutron-sensitive composition. The concentration of silicon oxide can range from approximately 62 percent to approximately 68 percent. The silicon oxide concentration can be greater than or equal to, in weight percent, approximately 62%, approximately 63%, approximately 64%, approximately 65%, approximately 66%, or approximately 67%; and/or less than or equal to approximately 68%, approximately 67%, approximately 66%, approximately 65%, approximately 64%, or approximately 63%. In some embodiments, the concentration of silicon oxide is selected so that the melting temperature of the neutron-sensitive composition is less than or equal to approximately 1500° C., which can ease processability of the composition.

Alkaline oxides (e.g., $Na_2O$) are used as glass modifiers, e.g., to enhance ease of fabrication, and to provide enhanced secondary electron yield by lowering the surface work function. The concentration of alkaline oxides can range from approximately 10 weight percent to approximately 14 weight percent. For example, the concentration of alkaline earth can be greater than or equal to, in weight percent, approximately 10%, approximately 11%, approximately 12%, or approximately 13%; and/or less than or equal to approximately 14%, approximately 13%, approximately 12%, or approximately 11%.

Alkaline earth oxides (e.g., MgO and CaO) are used to enhance the stability of the neutron-sensitive compositions. It is believed that these oxides can modify the structure of the compositions (e.g., by filling atomic holes) to enhance stability. The concentration of alkaline earth oxides can range from approximately 0 weight percent to approximately 7 weight percent. For example, the concentration of alkaline earth oxides can be greater than or equal to, in weight percent, approximately 0%, approximately 1%, approximately 2%, approximately 3%, approximately 4%, approximately 5%, or approximately 6%; and/or less than or equal to approximately 7%, approximately 6%, approximately 5%, approximately 4%, approximately 3%, approximately 2%, or approximately 1%.

More specifically, as indicated in Table 1, the concentrations of calcium oxide and magnesium oxide can each independently range, respectively, from approximately 0 percent to approximately 4 percent, and from approximately 0 percent to approximately 3 percent. The calcium oxide concentration can be greater than or equal to, in weight percent, approximately 0%, approximately 1%, approximately 2%, or approximately 3%; and/or less than or equal to approximately 4%, approximately 3%, approximately 2%, or approximately 1%. The magnesium oxide concentration can be greater than or equal to, in weight percent, approximately 0%, approximately 1%, or approximately 2%; and/or less than or equal to approximately 3%, approximately 2%, or approximately 1%.

Arsenic oxide is used as a fining agent during the glass melting process. The concentration of arsenic oxide can range from approximately 0 weight percent to approximately 0.5 weight percent. For example, the arsenic oxide concentration can be greater than or equal to, in weight percent, approximately 0%, or approximately 0.25%; and/or less than or equal to approximately 0.5%, or approximately 0.25%. Arsenic oxide can be replaced, wholly or partially, with antimony oxide. For example, the concentration of antimony oxide can range from approximately 0 weight percent to approximately 0.5 weight percent, such as greater than or equal to, in weight percent, approximately 0%, or approximately 0.25%; and/or less than or equal to approximately 0.5%, or approximately 0.25%.

In some embodiments, the neutron-sensitive compositions are substantially free of lead (e.g., lead oxide). For example, the composition can include less than, in weight percent, approximately 10%, approximately 5%, approximately 3%, or approximately 1% of lead oxide. A low lead content can provide MCP 20 with low sensitivity to gamma rays. When glass contains lead, the lead can interact with gamma rays to produce photoelectrons that result in cascades of electrons in channels 28. This may cause false detection of neutrons because it is unclear whether a detection signal received from MCP 20 is caused by a neutron or a gamma ray. Thus, it is advantageous to reduce the sensitivity of MCP 20 to gamma rays during neutron detection.

Reducing the sensitivity of MCP 20 to gamma rays can increase the signal-to-noise (S/N) ratio of neutron detection, leading to higher contrast radiography and detection of smaller features using neutron imaging. The insensitivity of MCP 20 to gamma rays also allows lower level detection of clandestine nuclear materials, such as plutonium.

In other embodiments, neutron-sensitive compositions can include both boron and gadolinium, or does not include boron. The compositions can include as an intimate and homogeneous mixture, in weight percent:

TABLE 2

| Material | Weight Percent |
|---|---|
| $Al_2O_3$ | 1-3 |
| $B_2O_3$ | 0-12 |
| $SiO_2$ | 40-68 |
| $Li_2O$ | 0-2 |
| $Na_2O$ | 2-8 |
| CaO | 2-6 |
| BaO | 0-10 |
| ZnO | 3-10 |
| $TiO_2$ | 0-3 |
| $Gd_2O_3$ | 10-20 |
| $Sb_2O_3$ | 0-1 |

The functions or purposes of the materials in the neutron-sensitive compositions are similar to those described above.

In some embodiments, the compositions consist essentially of or consist of the materials listed in Table 2 and described below.

In embodiments in which the boron- and -gadolinium-containing compositions include titanium oxide, aluminum oxide is further believed to work with titanium oxide to strengthen the compositions. The concentration of aluminum oxide can range from approximately one weight percent to approximately 3 weight percent. For example, the aluminum oxide concentration can be greater than or equal to, in weight percent, approximately 1%, or approximately 2%; and/or less than or equal to approximately 3% or approximately 2%.

The concentration of boron oxide (natural and/or enriched boron oxide) can range from approximately zero weight percent to approximately 12 weight percent, for example, approximately 6 percent to approximately 12 percent. For example, the boron oxide concentration can be greater than or equal to, in weight percent, approximately 0%, approximately 1%, approximately 2%, approximately 3%, approximately 4%, approximately 5%, approximately 6%, approximately 7%, approximately 8%, approximately 9%, approximately 19%, or approximately 11%; and/or less than or equal to approximately 12%, approximately 11%, approximately 10%, approximately 9%, approximately 8%, approximately 7%, approximately 6%, approximately 5%, approximately 4%, approximately 3%, approximately 2%, or approximately 1%. In some embodiments, the compositions are substantially free of boron oxide. Similar to the compositions described above, these compositions can include natural boron oxide only, enriched boron oxide only, or a mixture of natural and enriched boron oxides.

The concentration of silicon oxide can range from approximately 40 weight percent to approximately 68 weight percent, for example, approximately 40 weight percent to approximately 55 weight percent. The silicon oxide concentration can be greater than or equal to, in weight percent, approximately 40%, approximately 42%, approximately 44%, approximately 46%, approximately 48%, approximately 50%, approximately 52%, approximately 54%, approximately 56%, approximately 58%, approximately 60%, approximately 62%, approximately 64%, or approximately 66%; and/or less than or equal to approximately 68%, approximately 66%, approximately 64%, approximately 62%, approximately 60%, approximately 58%, approximately 56%, approximately 54%, approximately 52%, approximately 50%, approximately 48%, approximately 46%, approximately 44%, or approximately 42%. In some embodiments, the concentration of silicon oxide is decreased as much as possible to yield a workable glass so that the concentration to gadolinium oxide can be increased for enhanced neutron sensitivity.

The alkaline oxides (e.g., $Li_2O$ and/or $Na_2O$,) are used as glass modifiers, for example, to lower the melting temperature of the neutron-sensitive compositions, thereby aiding processability and to dissolve silicon oxide. The concentration of alkaline oxides can range from approximately 2 weight percent to approximately 10 weight percent, for example, from approximately 2 weight percent to approximately 7 weight percent. For example, the concentration of alkaline earth oxides can be greater than or equal to, in weight percent, approximately 2%, approximately 3%, approximately 4%, approximately 5%, approximately 6%, approximately 7%, approximately 8%, or approximately 9%; and/or less than or equal to approximately 10%, approximately 9%, approximately 8%, approximately 7%, approximately 6%, approximately 5%, approximately 4%, or approximately 3%.

More specifically, as indicated in Table 2, the concentration of lithium oxide can range from approximately zero weight percent to approximately 2 weight percent, and the concentration of sodium oxide can range from approximately 2 weight percent to approximately 8 weight percent. The lithium oxide concentration can be greater than or equal to, in weight percent, approximately 0%, approximately 0.5%, approximately 1.0%, or approximately 1.5%; and/or less than or equal to approximately 2%, approximately 1.5%, approximately 1%, or approximately 0.5%. The sodium oxide concentration can be greater than or equal to, in weight percent, approximately 2%, approximately 3%, approximately 4%, approximately 5%, approximately 6%, or approximately 7%; and/or less than or equal to approximately 8%, approximately 7%, approximately 6%, approximately 5%, approximately 4%, or approximately 3%.

As indicated in Table 2, the concentration of calcium oxide can range from approximately 2 weight percent to approximately 6 weight percent, and the concentration of barium oxide can range from approximately zero weight percent to approximately 10 weight percent. The calcium oxide concentration can be greater than or equal to, in weight percent, approximately 2.0%, approximately 2.5%, approximately 3.0%, approximately 3.5%, approximately 4.0%, approximately 4.5%, approximately 5.0%, or approximately 5.5%; and/or less than or equal to approximately 6.0%, approximately 5.5%, approximately 5.0%, approximately 4.5%, approximately 4.0%, approximately 3.5%, approximately 3.0%, or approximately 2.5%. The barium oxide concentration can be greater than or equal to, in weight percent, approximately 0%, approximately 1%, approximately 2%, approximately 3%, approximately 4%, approximately 5%, approximately 6%, approximately 7%, approximately 8%, or approximately 9%; and/or less than or equal to approximately 10%, approximately 9%, approximately 8%, approximately 7%, approximately 6%, approximately 5%, approximately 4%, approximately 3%, approximately 2%, or approximately 1%. In some embodiments, zinc oxide can be substituted for calcium oxide and/or barium oxide.

ZnO is used to adjust the coefficient of thermal expansion. The concentration of zinc oxide can range from approximately 3 percent to approximately 10 percent in weight percent. The zinc oxide concentration can be greater than or equal to, in weight percent, approximately 3%, approximately 4%, approximately 5%, approximately 6%, approximately 7%, approximately 8%, or approximately 9%; and/or less than or equal to approximately 10%, approximately 9%, approximately 8%, approximately 7%, approximately 6%, approximately 5%, or approximately 4%.

Titanium oxide is used to strengthen the network of the glass and to make the glass more durable. The concentration of titanium oxide can range from approximately zero weight percent to approximately 3 weight percent. The titanium oxide concentration can be greater than or equal to, in weight percent, approximately 0%, approximately 0.5%, approximately 1.0%, approximately 1.5%, approximately 2.0%, or approximately 2.5%; and/or less than or equal to approximately 3.0%, approximately 2.5%, approximately 2.0%, approximately 1.5%, approximately 1.0%, or approximately 0.5%.

Like boron oxide, gadolinium oxide is used for neutron capture. In particular, gadolinium can be used to detect thermal neutrons, while boron can be used to detect neutrons with higher energies. The concentration of gadolinium oxide can range from approximately 10 weight percent to approximately 20 weight percent. For example, the gadolinium oxide concentration can be greater than or equal to, in weight percent, approximately 10%, approximately 11%, approximately 12%, approximately 13%, approximately 14%, approximately 15%, approximately 16%, approximately 17%, approximately 18%, or approximately 19%; and/or less than or equal to approximately 20%, approximately 19%, approximately 18%, approximately 17%, approximately 16%, approximately 15%, approximately 14%, approximately 13%, approximately 12%, or approximately 11%.

Antimony oxide is used as a fining agent during the glass melting process. The concentration of arsenic oxide can range from approximately 0 weight percent to approximately 1 weight percent. For example, the concentration of antimony oxide can be greater than or equal to, in weight percent, approximately 0%, approximately 0.25%, approximately 0.5%, or approximately 0.75%; and/or less than or equal to approximately 1%, approximately 0.75%, approximately 0.5%, or approximately 0.25%. In some embodiments, antimony can be replaced with arsenic up to less than one weight percent arsenic.

In some embodiments, the neutron-sensitive compositions are substantially free of lead (e.g., lead oxide). For example, the composition can include less than, in weight percent, approximately 10%, approximately 5%, approximately 3%, or approximately 1% of lead oxide. A low lead content can provide the features and/or advantages discussed above.

Illustrative examples of neutron-sensitive compositions are provided, in weight percent, in Table 3 below.

TABLE 3

| Material | Example 1 | Example 2 | Example 3 |
| --- | --- | --- | --- |
| $Al_2O_3$ | 2.5 | 2.5 | 2.0 |
| $B_2O_3$ | 15.2 | 15.4 | 10.8 |
| $SiO_2$ | 64.5 | 65 | 47.2 |
| $Na_2O$ | 12.9 | 11.4 | 2.4 |
| CaO | 2.7 | 2.8 | 4.0 |
| MgO | 1.8 | 1.8 | — |
| $As_2O_3$ | 0.3 | 0.3 | — |
| $Li_2O$ | — | 0.7 | 0.6 |
| BaO | — | — | 6.0 |
| ZnO | — | — | 6.0 |
| $Gd_2O_3$ | — | — | 18.6 |
| $Sb_2O_3$ | — | — | 0.4 |

The neutron-sensitive compositions described herein can be synthesized by conventional glass fabrication techniques. The starting raw materials (e.g., a batch of up to 2.3 kg. of oxides, carbonates, and/or hydroxides) can be mixed within the appropriate batch concentrations and melted using standard practice, e.g., at temperatures greater than 1350° C. (such as 1350° C.-1475° C.) for more than four hours (such as 4-6 hours). When the composition is molten, it can be stirred to enhance homogeneity. The molten composition can be formed into rods, tubes, or boules. The composition can then be reformed (e.g., extruded using a glass extruder), if wanted, at temperatures higher than the softening point of the composition into shapes that can be fiberized. The solid compositions should be a homogeneous, one-phase mixture that appears uniformly homogeneous, clear, and with no apparent crystallization or devitrification.

Figure 4:
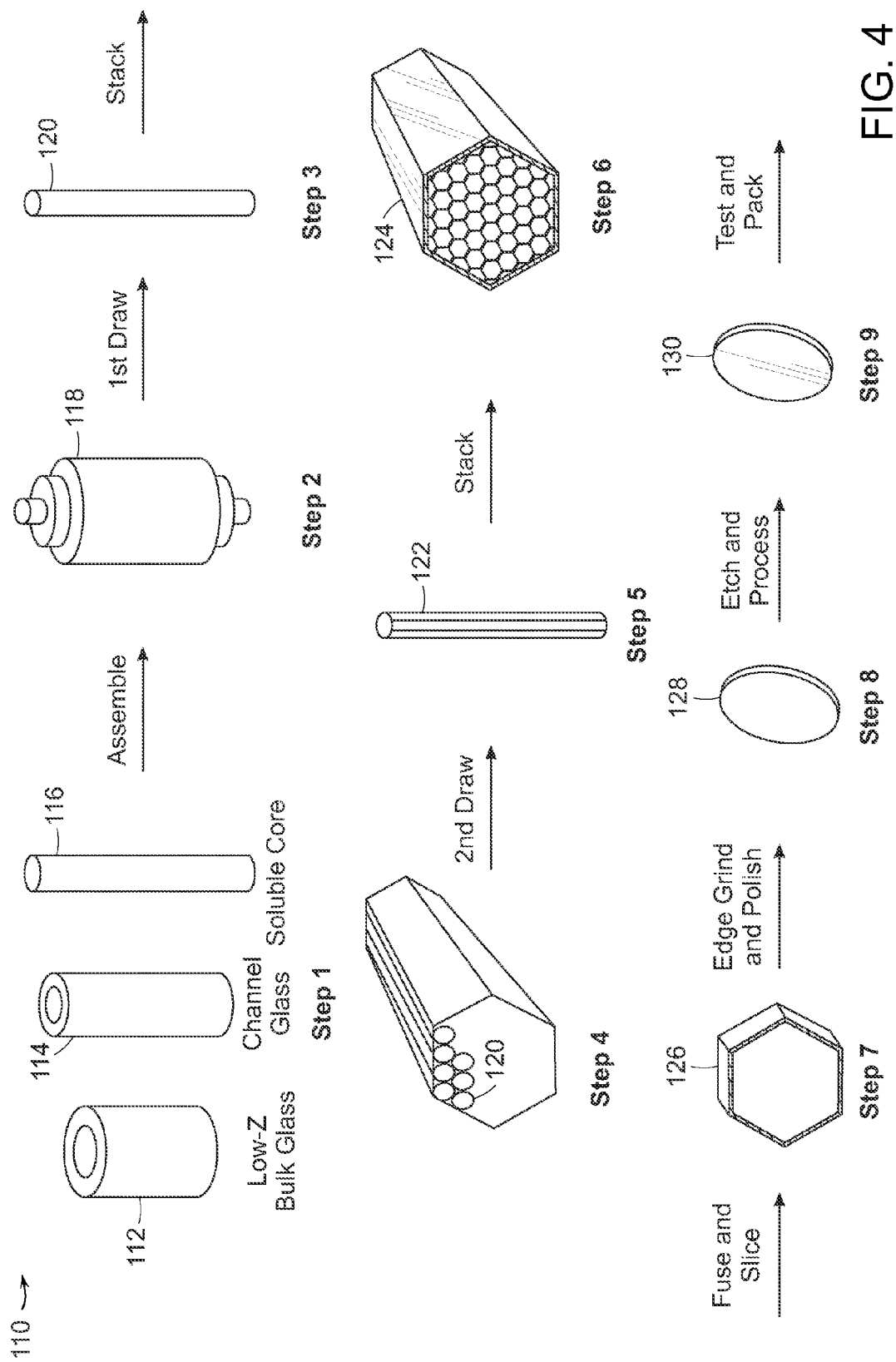
FIG. 4 is a diagram of a process for fabricating a microchannel plate.

FIG. 4 is a diagram of a process 110 for fabricating microchannel plate 20, which is also described in U.S. Pat. No. 7,333,701, hereby incorporated by reference.

Step 1: Low-Z bulk glass that includes a high percentage of boron-10 as described herein is melted and cast into right cylinders and reworked into a bulk glass tube 112 by high-temperature extrusion through a set of dies. Low-Z glass refers to glass that has a low percentage (e.g., less than 1 mol %) of materials having atomic numbers larger than 34. Similarly, channel glass that includes a higher or high percentage of lead (e.g., more than 10 mol % of lead) is melted, cast, and reworked into a channel glass tube 114. Examples of channel glasses are described in U.S. Pat. Nos. 4,983,551 (Feller); 5,108,961 (Zhong); and 5,015,909 (Zhong).

Bulk glass tube 112 may have a wall thickness that is, e.g., five times the wall thickness of channel glass tube 114. Soluble core glass (e.g., a glass that is susceptible to chemical etching by an appropriate etching solution) is made into a rod 116 having a diameter of, e.g., one inch. The inner diameter of channel glass tube 114 is slightly larger than the diameter of core glass rod 116, and the inner diameter of bulk glass tube 112 is slightly larger than the outer diameter of channel glass tube 114.

Steps 2 and 3: Core glass rod 116 is inserted into channel glass tube 114, which is inserted into low-Z bulk glass tube 112. A combination 118 of rod 116 and glasses 112, 114 is heated and drawn into a pencil sized rod 120 (e.g., combination 118 is pulled to become longer and have a smaller diameter).

Steps 4 and 5: A series of drawn rods 120 are bundled, heated, and drawn into a fiber 122 such that the initial one-inch diameter core rod 116 is reduced to 5 micrometers in diameter. For example, to form a glass fiber, the glass assembly can be slowly fed downwards into a furnace. As the assembly is fed downward, the glass begins a viscous flow to form a cone. The glass can then be drawn downward past the bottom of the furnace to form a rigid glass fiber. The fiber can be continuously drawn off of a viscous cone or cut into sections. The glass assembly can be fed slowly into the furnace such that the lower end thereof is continuously heated and maintained at a constant temperature. The glass fiber can be drawn off the continuously heated assembly at a continuous rate of speed to form a uniform diameter fiber. Further, the clad tube and the glass core can be fused together so that the fiber consists of a solid center core with a fused outer coating. The center core can be of uniform diameter, as is the outer coating, and the center core can be completely coated with no breaks, cracks or the like. Each fiber can include a glass core whose outer periphery is surrounded by a neutron-sensitive glass clad layer.

Step 6: Drawn fibers 122 are assembled in a hexagonal preform 124 and fused together forming a solid glass billet. For example, several thousand of the fibers can be cut into lengths of single fibers which are then clamped together and then heated and drawn, at an appropriate drawing temperature of the glass in order to form, for example, a hexagonal array. A plurality of hexagonal arrays, each having several thousand single fibers, can be assembled into a multi-assembly. The multi-assembly can be fused together in a furnace to maintain the hexagonal configuration within an annular outer ring, and to form the billet.

Step 7: The billet is sliced into thin wafers 126 at a 0.5-1 degree bias (for accurate neutron event localization and minimal parallax blurring).

Step 8: The faces of thin wafer 126 are polished, and the edges of the wafer 126 are ground into a round shape to produce a solid microchannel plate blank 128.

Step 9: The solid microchannel plate blank 128 is immersed into a dilute acid (e.g, hydrochloric acid or nitric acid) to etch away core glass 116, leaving millions of small holes in the range of about 5 to 10 micrometers in diameter. An example of an etching can be as follows. Blank 128 is pre-cleaned by immersion in a micro-detergent for several minutes under ultrasonic agitation, with rinses. To remove core glass 116, the glass is etched in 1N nitric acid for several hours at room temperature. The glass is then rinsed. To remove any remaining debris left behind from the acid etch and to remove any remaining diffusion layer lining the inner channel wall so as to leave a pristine channel wall surface, the glass is caustically etched in 1N sodium hydroxide at 80° C. for several minutes. The glass is then rinsed. Next, leaching is performed in 0.1N hydrochloric acid for 3-7 minutes at room temperature to remove lead out of the topmost vitreous silica surface layer (e.g., the top 100-200 angstroms) so as to increase (e.g., maximize) secondary electron yield. The glass is then rinsed, cleaned by immersion in isopropyl alcohol for approximately 15 minutes under ultrasonic agitation, and dried. A microchannel plate blank 128 having a diameter of one inch may have about three to five million microchannels.

After etching, the microchannels are reduced, for example, by heat-treating in an atmosphere containing hydrogen at high temperatures, where certain reducible oxides, such as lead oxide, are chemically reduced to develop a semiconducting surface used for electron multiplication. The exact temperature and soak time in a hot hydrogen atmosphere can determine how well an MCP functions and can vary, depending upon the exact material composition. Some exemplary hydrogen reduction process soak temperatures and soak times that provide stable operation, permit a semiconducting layer to be well formed, and provide good gain and background noise performance, include approximately 400° C. to approximately 440° C. for approximately 3 hours to approximately 16 hours. In some embodiments, the operation has a gain stability over an accumulated output charge level of approximately >0.01 coulomb/cm$^2$. The gain can drop by less than, for example, approximately 10%. The background noise can be approximately <1 count/cm$^2$/sec of noise. This reduction process can result in an inner channel wall that is semiconducting (e.g., approximately $10^{12}$ ohms/square to approximately $10^{14}$ ohms/square), so that a small bias or leakage current can flow when high voltage is applied to electrodes on either face of the MCP. A superficial vitreous silica layer, approximately 100-200 Å thick, can overlay the semiconducting inner channel wall, and provides the secondary electrons needed to form the electron cascade or avalanche within the hollow channel The faces of the microchannel plate 130 are coated with a electrically conductive material (e.g., nichrome) to serve as the electrodes for application of a voltage to generate electric fields in the microchannels. This completes the processing of microchannel plate 20, which is ready for testing and packaging.

While a number of embodiments have been described, the invention is not so limited.

Figure 5:
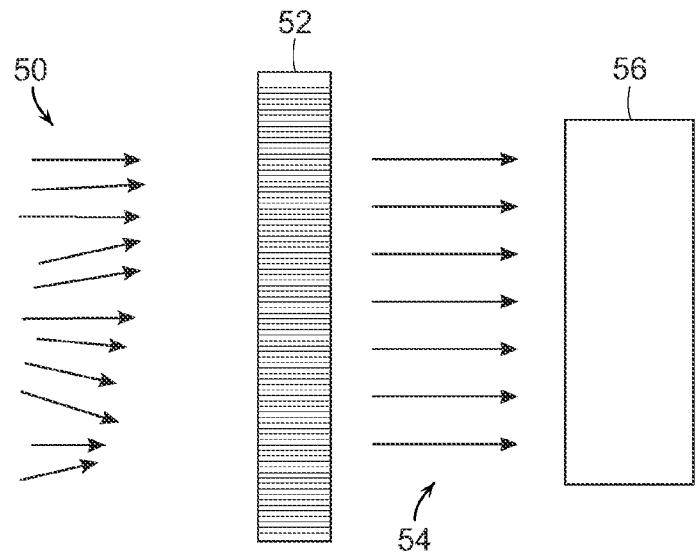
FIGS. 5 and 6 are schematic diagrams illustrating neutron collimation.
Figure 6:
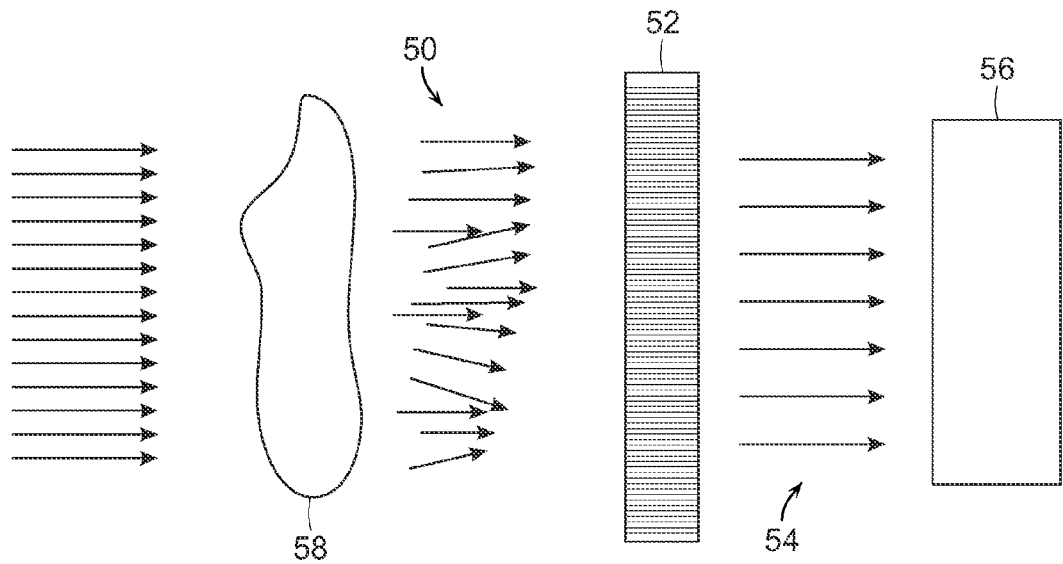

For example, the neutron-sensitive compositions described herein, which is also capable of absorbing neutrons, can be used in a neutron collimator to collimate or remove off-axis neutrons. Neutron collimators can play an important ancillary role in neutron scientific studies, for example, through beam dispersion improvements collimators with high L/Ds (length-to-diameter ratio of the microchannels), and through use of thinner collimators. Efficient neutron collimators can provide enhanced capabilities for neutron experimentation. For example, referring to FIGS. 5 and 6, an uncollimated beam (as shown, a probe neutron beam 50) can be shaped by a collimator 52 to produce a collimated neutron beam 54 with reduced beam divergence, which can lead to reduced image blurring on a detector 56 (FIG. 5). A collimator 52 can also be used for scatter rejection when it is placed between an object 58 under study and a detector 56 (FIG. 6). A neutron-sensitive collimator can be made as described above for MCP 20, except a conducting or an electron-emissive layer or material is not required. The neutron-sensitive compositions can be used as the material for the structure that defines the channels (e.g., like low-Z bulk glass 112), and the channels can be open. The channels can also be filled with a core glass provided that the core glass does not have a significant amount of neutron-absorbing elements, such as B, Gd, and Li. Alternatively, the neutron-sensitive compositions can be used as the material in the channels (e.g., like soluble core 116). In these later embodiments, the material that defines the channels, e.g., a glass material, may not be neutron-sensitive.

Other embodiments of MCPs, all of which can include the neutron-sensitive compositions described herein, are described in U.S. Pat. No. 6,828,714; and U.S. Patent Application Publications 2003/0205956, 2004/0256967, and 2005/0205798.

In some embodiments, more than one neutron-sensitive material can be included in a device, e.g., an electron multiplier.

The neutron-sensitive materials described herein can be used in dual gamma and neutron detectors (e.g., in an MCP), as described in U.S. Provisional Patent Application 60/893,484, filed on Mar. 7, 2007.

All references, such as patents, patent applications, and publications, referred to above are incorporated by reference in their entirety.

Still other embodiments are within the scope of the following claims.

What is claimed is:

1. A method, comprising:
    contacting a neutron detector comprising an electron multiplier in the form of a microchannel plate having a neutron-sensitive composition with neutrons, the composition comprising, in weight percent,
        a non-zero amount of aluminum oxide,
        approximately 12% to approximately 17% boron oxide, greater than approximately 60% silicon oxide, and
        a non-zero amount of sodium oxide; and
    detecting a signal indicating a plurality of secondary electrons resulting from the contact of at least one of the neutrons with the composition of the electron multiplier;
    wherein the neutron-sensitive composition forms the bulk structure of the microchannel plate, the bulk structure defining a plurality of channels.

2. The method of claim 1, wherein the boron oxide comprises substantially boron-10 enriched boron oxide.

3. The method of claim 1, wherein the composition further comprises a non-zero amount of calcium oxide less than approximately 4 weight percent.

4. The method of claim 1, wherein the composition further comprises a non-zero amount of magnesium oxide less than approximately 3 weight percent.

5. The method of claim 1, wherein the composition further comprises a non-zero amount of arsenic oxide or antimony oxide less than approximately 0.5 weight percent.

6. The method of claim 1, wherein the composition further comprises a non-zero amount of lithium oxide less than approximately 2 weight percent.

7. The method of claim 1, wherein the composition is substantially free of lead.

8. The method of claim 1, wherein the composition consists essentially of, in weight percent, approximately 1% to approximately 3.5% aluminum oxide, approximately 12% to approximately 17% boron oxide, approximately 62% to approximately 68% silicon oxide, approximately 10% to approximately 14% sodium oxide, approximately 0% to approximately 4% calcium oxide, approximately 0% to approximately 3% magnesium oxide, approximately 0% to approximately 0.5% antimony oxide or arsenic oxide, and approximately 0% to approximately 2% lithium oxide.

9. The method of claim 8, wherein the boron oxide is substantially boron-10 enriched boron oxide.

10. The method of claim 1, wherein the channels comprise a conducting and electron emissive surface.

11. The method of claim 1, further comprising detecting additional signals each indicating a plurality of secondary electrons, and processing the signal and the additional signals to construct an image.

* * * * *